US012677402B2

(12) United States Patent
Teng et al.

(10) Patent No.: US 12,677,402 B2
(45) Date of Patent: Jul. 7, 2026

(54) VEHICLE DISPLAY APPARATUS INTEGRATED WITH A TEMPERATURE REGULATOR

(71) Applicant: Continental Automotive Technologies GmbH, Hannover (DE)

(72) Inventors: Ling Chih Teng, Singapore (SG); Zhixiong Jiang, Singapore (SG); Han Lin Fong, Singapore (SG); Hee Lee Koh, Singapore (SG); Chun How Low, Singapore (SG)

(73) Assignee: Continental Automotive Technologies GmbH, Hannover (DE)

( * ) Notice: Subject to any disclaimer, the term of this patent is extended or adjusted under 35 U.S.C. 154(b) by 155 days.

(21) Appl. No.: 18/234,071

(22) Filed: Aug. 15, 2023

(65) Prior Publication Data

US 2024/0064935 A1 Feb. 22, 2024

(30) Foreign Application Priority Data

Aug. 19, 2022 (GB) ...................................... 2212089

(51) Int. Cl.
*H05K 7/20* (2006.01)
*B60H 1/00* (2006.01)
(Continued)

(52) U.S. Cl.
CPC ..... *H05K 7/20972* (2013.01); *B60H 1/00271* (2013.01); *B60K 35/22* (2024.01);
(Continued)

(58) Field of Classification Search
CPC ............ H05K 7/20972; B60H 1/00271; B60H 1/003; B60K 35/00; B60K 35/22; B60K 35/23; B60K 2360/658
See application file for complete search history.

(56) References Cited

U.S. PATENT DOCUMENTS 6,561,016 B1 * 5/2003 Suhre ...................... F02D 41/18
73/114.37
11,208,972 B2 * 12/2021 Klanow ............. F02M 35/1222
(Continued)

FOREIGN PATENT DOCUMENTS

CN 114360362 A 4/2022
DE 102019127436 B3 12/2020
(Continued)

OTHER PUBLICATIONS

European Examination Report dated Jan. 17, 2024 from corresponding European Application No. 23172777.7.
(Continued)

*Primary Examiner* — Robert J Hoffberg
(74) *Attorney, Agent, or Firm* — COZEN O'CONNOR

(57) ABSTRACT

A vehicle display apparatus comprising a processor and a temperature regulator is disclosed. The temperature regulator is operable to allow a fluid flow to enter a fluid flow inlet of the vehicle display apparatus or prevent a fluid flow to enter a fluid flow inlet of the vehicle display apparatus. The temperature regulator further comprises: an actuator having a shaft, the actuator operable to rotate the shaft, and a rotatable tab in communication with the actuator, the rotatable tab operable to rotate synchronously in response to a rotation of the shaft. The processor is operable to execute a command to allow the fluid flow to enter the fluid flow inlet of the vehicle display apparatus; or to prevent the fluid flow to enter the fluid flow inlet of the vehicle display apparatus by rotating the shaft of the actuator to change a position of the rotatable tab.

14 Claims, 3 Drawing Sheets

(51) Int. Cl.

| | |
|---|---|
| B60K 35/22 | (2024.01) |
| *G02F 1/1333* | (2006.01) |
| *G02F 1/1335* | (2006.01) |
| *G02F 1/139* | (2006.01) |

(52) U.S. Cl.
CPC ... *H05K 7/20145* (2013.01); *B60H 2001/003* (2013.01); *G02F 1/133385* (2013.01); *G02F 1/133628* (2021.01); *G02F 1/1396* (2013.01)

(56) References Cited

U.S. PATENT DOCUMENTS

| | | | |
|---|---|---|---|
| 2012/0300486 | A1 | 11/2012 | Matsushita et al. |
| 2018/0099542 | A1 | 4/2018 | Sakakibara et al. |
| 2019/0182994 | A1 | 6/2019 | O'Connell et al. |
| 2022/0314745 | A1 * | 10/2022 | Lee ........................ B60K 37/20 |

FOREIGN PATENT DOCUMENTS

| | | | |
|---|---|---|---|
| EP | 1260391 | B1 | 3/2004 |
| JP | 2019108071 | A | 7/2019 |
| JP | 2021088217 | A * | 6/2021 |
| JP | 2021104781 | A | 7/2021 |
| WO | 2015010383 | A1 | 1/2015 |

OTHER PUBLICATIONS

Search Report dated Feb. 9, 2023 from corresponding GB patent application No. 2212089.3.

\* cited by examiner

500

VEHICLE DISPLAY APPARATUS INTEGRATED WITH A TEMPERATURE REGULATOR

CROSS REFERENCE TO RELATED APPLICATION

This U.S. patent application claims the benefit of United Kingdom patent application No. 2212089.3, filed Aug. 19, 2022, which is hereby incorporated by reference.

TECHNICAL FIELD

This disclosure relates to a temperature regulator for integrating with a display apparatus for thermal management, and more in particular, the temperature regulator controls a fluid flow drawn from a HVAC system.

BACKGROUND

Display apparatus is commonly used in automotive industry for displaying vehicular information. A display apparatus includes an illumination source to transmit light rays towards a viewer, such that information displayed can be viewed on the displays screen. In operation, the illumination source generates heat and only 40% of electrical power is converted to light rays. The remaining 60% of electrical power is dissipated as heat. In automotive applications, temperature of an operating display apparatus has an ambient temperature of 85° C. Therefore, efficient thermal management to avoid overheating of display systems is crucial to prevent damage to the display systems.

To achieve high-definition images, liquid crystal displays (LCD) technology may be applied to automotive applications. The polarization of light for liquid crystals in LCD panels requires sufficiently high temperature to enable twisting of the liquid crystals, failure of which may result in image distortion and jittering caused by sluggish/slow twisting of liquid crystals due to low temperature. On the other hand, since the LCD display in an automotive environment is expected to be exposed to extremely high temperature, the LCD display is at risk of overheating.

There is therefore a need to provide to provide a temperature regulator integrated into a display system that overcomes, or at least ameliorates, the problems described above. Furthermore, other desirable features and characteristics will become apparent from the subsequent detailed description and the appended claims, taking in conjunction with the accompanying drawings and this background of the disclosure.

SUMMARY

A purpose of this disclosure is to ameliorate the problem of image distortion and jittering caused by sluggish or slow twisting of twisted nematic (TN) display panels used in automotive applications, by providing the subject-matter of the independent claims.

Further purposes of this disclosure are set out in the accompanying dependent claims.

The objective of this disclosure is solved a vehicle display apparatus comprising a processor and a temperature regulator operable to allow a fluid flow to enter a fluid flow inlet of the vehicle display apparatus, or prevent a fluid flow to enter a fluid flow inlet of the vehicle display apparatus, wherein the temperature regulator further comprises an actuator having a shaft, the actuator operable to rotate the shaft, and a rotatable tab in communication with the actuator, the rotatable tab operable to rotate synchronously in response to a rotation of the shaft.

The above described aspect of this disclosure yields a vehicle display apparatus integrated with a temperature regulator to allow fluid flow to enter the vehicle display apparatus when a temperature of the vehicle display apparatus is too hot, to prevent overheating of the vehicle display apparatus, or prevent fluid flow to enter the vehicle display apparatus when a temperature of the vehicle apparatus is too cold and more in particular causing slow twisting to TN display panels for light polarization. Consequently, a main advantage of this disclosure is to avoid image distortion and jittering caused by sluggish/slow twisting of TN display panel due to low temperature, yet at the same time avoid overheating of the TN display panel, by controlling a temperature of a vehicle display apparatus using a TN display panel.

In an embodiment of a vehicle display apparatus as described above, the processor is operable to execute a command to allow the fluid flow to enter the fluid flow inlet of the vehicle display apparatus, or to prevent the fluid flow to enter the fluid flow inlet of the vehicle display apparatus.

The above aspect of this disclosure is to regulate a temperature of the vehicle display apparatus to a higher temperature or a lower temperature. This is achieved by controlling fluid flow entering the vehicle display apparatus through a fluid flow inlet, i.e. turn on the temperature regulator, or preventing fluid flow from entering the vehicle display apparatus through a fluid flow inlet, i.e. turn off the temperature regulator, using a processor.

In an embodiment of a vehicle display apparatus as described above, in response to the command executed by the processor to allow the fluid flow to enter the fluid flow inlet of the vehicle display apparatus, the actuator is operable the rotate the shaft, thereby causing the rotatable tab to rotate synchronously at an angle of 90° to a width of the fluid flow inlet.

The above aspect of this disclosure is to allow fluid flow to enter a vehicle display apparatus for cooling or warming function, to regulate a temperature of a display panel used in the vehicle display apparatus using a rotation an actuator and rotatable tab to change a position of the rotatable tab at an angle of 90° to a width of a fluid flow inlet or opening, to allow fluid flow to enter the vehicle display apparatus, i.e. turn on the temperature regulator.

In an embodiment of a vehicle display apparatus as described above, in response to the command executed by the processor to prevent the fluid flow to enter the fluid flow inlet of the vehicle display apparatus, the actuator is operable the rotate the shaft, thereby causing the rotatable tab to rotate synchronously at an angle of 0° to a width of the fluid flow inlet.

The above aspect of this disclosure is to allow fluid flow to enter a vehicle display apparatus for cooling or warming function, to regulate a temperature of a display panel used in the vehicle display apparatus using a rotation an actuator and rotatable tab to change a position of the rotatable tab at an angle of 0° to a width of the fluid flow inlet, to prevent fluid flow to enter the vehicle display apparatus, i.e. turn off the temperature regulator.

In an embodiment of a vehicle display apparatus as described above, the vehicle display apparatus further comprises a heating, ventilation and air-conditioning (HVAC) system operable to supply the fluid flow to enter the fluid flow inlet of the vehicle display apparatus.

The above aspect of this disclosure is to regulate a temperature of a vehicle display apparatus by using fluid flow supplied from a HVAC system. The advantage of using fluid flow from a HVAC system of a motor vehicle is that the fluid flow may increase a temperature of the vehicle display apparatus, or decrease a temperature of the vehicle apparatus, to avoid image distortion and jittering caused by sluggish/slow twisting of TN display panel due to low temperature, yet at the same time avoid overheating of the TN display panel.

In an embodiment of a vehicle display apparatus as described above, the vehicle display apparatus further comprises a temperature measurement module operable to measure a set of temperature measurements.

The above aspect of this disclosure is to regulate the temperature of a vehicle display apparatus by providing a set of temperature reading to determine whether a position of the rotatable tab of the temperature regulator needs to be adjusted.

In an embodiment of a vehicle display apparatus as described above, the set of temperature measurement comprises a temperature of a display panel of the vehicle display apparatus, an operating temperature of the HVAC system, a temperature of a fluid flow from the HVAC system, or combination thereof.

The above aspect of this disclosure is to regulate the temperature of a vehicle display apparatus by providing temperature readings which may affect the temperature of the vehicle display apparatus, to determine whether a position of the rotatable tab of the temperature regulator needs to be adjusted. These temperature readings may include a temperature of a display panel of the vehicle display apparatus, an operating temperature of the HVAC system, a temperature of a fluid flow from the HVAC system, but not limited thereto.

In an embodiment of a vehicle display apparatus as described above, the set of temperature measurements measured is transmitted to the processor.

The above aspect of this disclosure is to regulate a temperature of a vehicle display apparatus by providing the set of temperature measurements measured to the processor, to determine whether it is necessary to turn on or turn off the temperature regulator, to maintain a desired temperature of the vehicle display apparatus.

In an embodiment of a vehicle display apparatus as described above, the vehicle display apparatus further comprises an angle measurement module operable to determine an angle of the rotatable tab.

The above aspect of this disclosure is to regulate a temperature of a vehicle display apparatus by determine an angle of the rotatable tab. More advantageously, this feature determines whether the temperature regulator is at a turn on position, i.e. at an angle of 90° to a width of the fluid flow inlet or a turn off position, i.e. at an angle of 0° to a width of the fluid flow inlet.

In an embodiment of a vehicle display apparatus as described above, the angle of the rotatable tab measured is transmitted to the processor.

The above aspect of this disclosure is to regulate a temperature of a vehicle display apparatus by providing a position of the rotatable tab to the processor, to determine whether it is necessary to re-adjust the position of the rotatable, for example from turn on position to turn off position or vice versa, to maintain a desired temperature of the vehicle display apparatus.

In an embodiment of a vehicle display apparatus as described above, the vehicle display apparatus further com prises at least two fluid flow outlets operable to transport the fluid flow from the fluid flow inlet towards the at least two fluid flow outlets.

The above aspect of this disclosure is to maintain a desired temperature of the vehicle apparatus by directing the fluid flow entering the vehicle display apparatus from the fluid flow inlet towards at least two fluid flow outlets, such that upon achieving a function of cooling the vehicle display apparatus or warming the vehicle display apparatus, the fluid flow is directed out of the vehicle display apparatus.

In an embodiment of a vehicle display apparatus as described above, the at least two fluid flow outlets are connected by a fluid channel to transport the fluid flow from the fluid flow inlet towards the at least two fluid flow outlets.

The above aspect of this disclosure is to provide a fluid direct a movement of a fluid flow within a vehicle display apparatus for regulating a temperature of the vehicle display apparatus.

In an embodiment of a vehicle display apparatus as described above, the temperature regulator is at least partially integrated with the vehicle display apparatus through a housing of the vehicle apparatus.

The above aspect of this disclosure is to provide the temperature regulator through an opening or fluid flow inlet which is integrated as part of a vehicle display apparatus such that fluid flow may be efficiently directed into the vehicle display apparatus.

In an embodiment of a vehicle display apparatus as described above, the display panel of the vehicle display apparatus comprises at least one type of twisted nematic (TN) display panel.

The above aspect of this disclosure is to regulate a temperature of a vehicle display apparatus, more in particular vehicle display apparatus using TN display panels, to high-definition images.

In an embodiment of a vehicle display apparatus as described above, a temperature of the fluid flow to enter the fluid flow inlet of the vehicle display apparatus is lower than the temperature of the vehicle display apparatus, or a temperature of the fluid flow to enter the fluid flow inlet of the vehicle display apparatus is higher than the temperature of the vehicle display apparatus.

The above aspect of this disclosure is to maintain a temperature of a vehicle display apparatus at a desired temperature, by allowing a fluid flow cooler or at a lower temperature as compared to a temperature of the vehicle display apparatus, or by preventing a fluid flow warmer than or at a higher temperature as compared to a temperature of the vehicle display apparatus.

In an embodiment of a vehicle display apparatus as described above, the fluid channel is at least partially surrounding an illumination source operable to supply illumination to the display panel.

The above aspect of this disclosure is to maintain a temperature of a vehicle display apparatus at a desired temperature, through thermal management of an illumination source or backlight unit operable to supply illumination to a display panel.

BRIEF DESCRIPTION OF THE DRAWINGS

Other objects and aspects of this disclosure will become apparent from the following description of embodiments with reference to the accompanying drawings in which.

In various embodiments described by reference to the above figures, like reference signs refer to like components in several perspective views and/or configurations.

DETAILED DESCRIPTION

The following detailed description is merely exemplary in nature and is not intended to limit the disclosure or the application and uses of the disclosure. Furthermore, there is no intention to be bound by any theory presented in the preceding background of the disclosure or the following detailed description. It is the intent of this disclosure to present a vehicle display apparatus integrated with a temperature regulator.

Hereinafter the term "fluid" shall refer to any substance that has no fixed shape and yields easily to external pressure. In the context used herein, the term "fluid flow" refers to a movement or direction of a fluid being transferred from one element to another element.

The term "regulator" shall refer to a device for controlling a rate of the fluid flow being transferred from one element to another element, in particular supplying a fluid from an exterior of a vehicle display apparatus into an interior of a vehicle display apparatus. Henceforth, the term "temperature regulator" used in this disclosure, shall refer to a device for controlling a rate of a fluid flow between a HVAC system and a vehicle display apparatus.

The term "processor" used in the context herein should be interpreted broadly to encompass a general-purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

Figure 1:
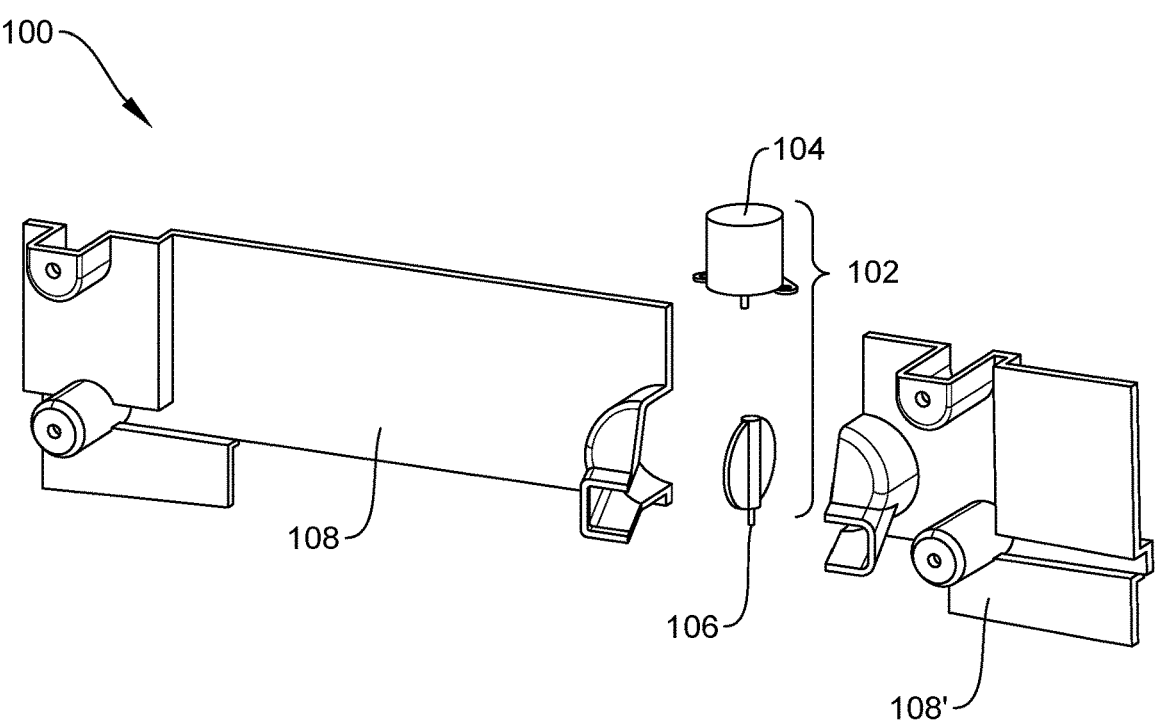
FIG. 1 shows an exploded view of an apparatus at least partially integrated with a temperature regulator in accordance with a preferred embodiment.

Referring to FIG. 1 of the accompanying drawings which shows an exploded view of an apparatus 100 a temperature regulator 102 in accordance with a preferred embodiment. The temperature regulator 102 comprises an actuator 104 and a rotatable tab 106. The temperature regulator 102 may be at least partially integrated with a housing 108, 108' of the apparatus 100. The temperature regulator 102 is operable to allow a fluid flow to enter a fluid flow inlet of the vehicle display apparatus. Further, the temperature regulator 102 is operable to prevent a fluid flow to enter a fluid flow inlet of the vehicle display apparatus. The actuator 104 includes a shaft (not shown) and the actuator operable to rotate the shaft at pre-determined angles. A suitable actuator to perform such function may be a stepper motor. The rotatable tab 106 is communication with the actuator. The rotatable tab 106 is operable to rotate synchronously in response to a rotation of the shaft of the actuator 104. The temperature regulator 102 may be controlled by a processor 502 (FIG. 5 referred), the processor 502 is operable to execute a command to allow the fluid flow to enter the fluid flow inlet of the vehicle display apparatus. Further, the processor 502 is operable to execute a command to prevent the fluid flow to enter the fluid flow inlet of the vehicle display apparatus.

Figure 2:
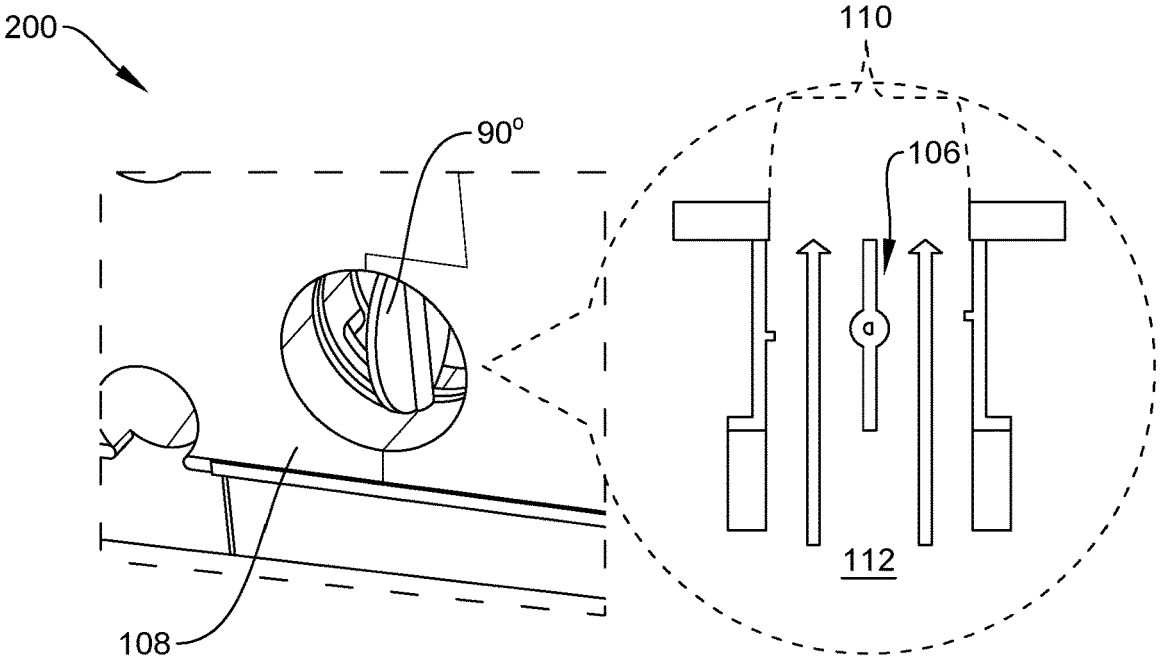
FIG. 2 shows a perspective view of a temperature regulator at a turn on or open position in accordance with a preferred embodiment.

FIG. 2 shows a perspective view 200 of a temperature regulator 102 at a turn on or open position in accordance with a preferred embodiment. In response to a command executed by the processor 502 to allow the fluid flow 112 to enter a fluid flow inlet 110 of the apparatus 100, the actuator 104 is operable the rotate the shaft, thereby causing the rotatable tab 106 to rotate synchronously at an angle of 90° to a width of the fluid flow inlet 110. Since the rotation of the rotatable tab 106 is now perpendicular to the fluid flow inlet 110, an opening is created and thus fluid flow 112 from a heating, ventilation and air-conditioning (HVAC) system may be transferred or directed towards the fluid flow inlet 110, into the apparatus 100, of which a direction of the fluid flow 112 is as indicated by two arrows in FIG. 2.

Figure 3:
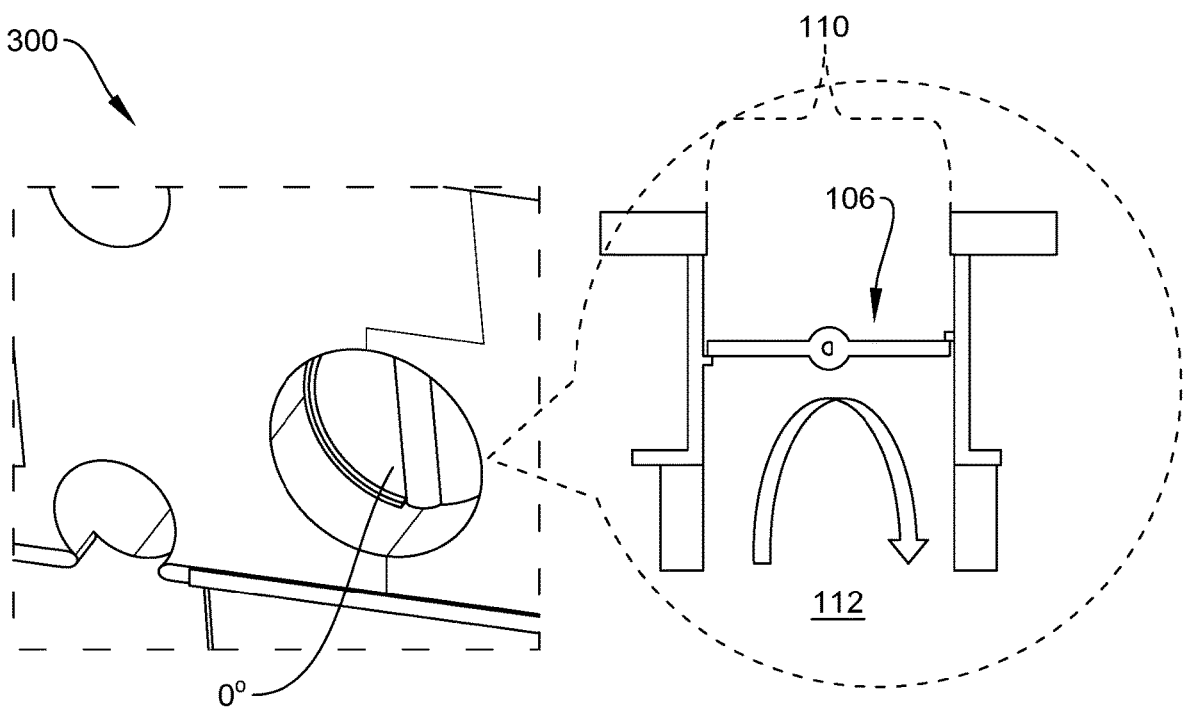
FIG. 3 shows a perspective view of a temperature regulator at a turn off or closed position in accordance with a preferred embodiment.

FIG. 3 shows a perspective view 300 of a temperature regulator 102 at a turn off or closed position in accordance with a preferred embodiment. In response to a command executed by the microcontroller 502 to prevent the fluid flow 112 to enter the fluid flow inlet 110 of the apparatus 100, the actuator 104 is operable the rotate the shaft, thereby causing the rotatable tab 106 to rotate synchronously at an angle of 0° to a width of the fluid flow inlet 110. As shown in FIG. 3, since the rotatable tab 106 covers the width of the fluid flow inlet 110, the fluid flow 112 is prevented from being transferred into the apparatus 100.

FIG. 3 shows a perspective view of a temperature regulator 102 at a turn off or closed position in accordance with a preferred embodiment. In response to a command executed by the microcontroller 502 to prevent the fluid flow 112 to enter the fluid flow inlet 110 of the apparatus 100, the actuator 104 is operable the rotate the shaft, thereby causing the rotatable tab 106 to rotate synchronously at an angle of 0° to a width of the fluid flow inlet 110. As shown in FIG. 3, since the rotatable tab 106 covers the width of the fluid flow inlet 110, the fluid flow 112 is prevented from being transferred into the apparatus 100.

A main advantage of the configuration of temperature regulator 102 is to regulate a fluid flow to enter or to prevent from being transferred into an ambient of the apparatus, to maintain the apparatus at a desired operating temperature using the actuator and rotatable tab assembly. More advantageously, the fluid flow inlet 110 may be connected to a HVAC system (not shown) to draw fluid flow 112 from the HVAC system towards the fluid flow inlet 110. A suitable connector may be a rubber tubing or hose.

Figure 4:
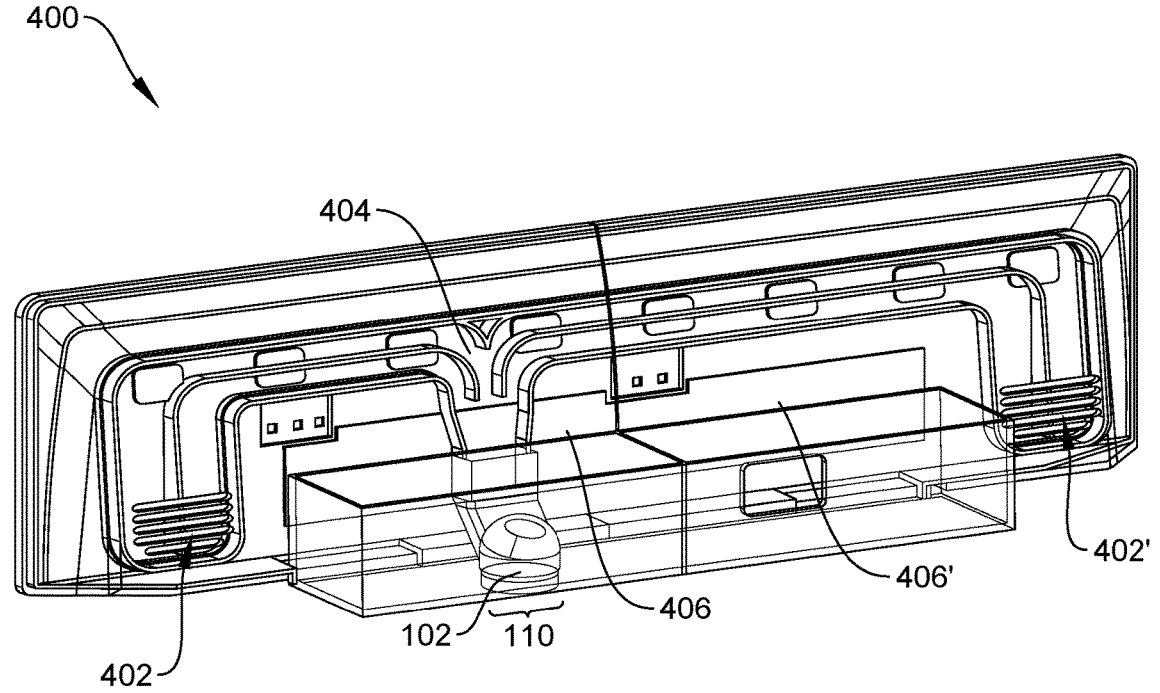
FIG. 4 shows a see-through view of a vehicle display apparatus from a rear side in accordance with a preferred embodiment.

FIG. 4 shows a see-through view of a vehicle display apparatus 400 from a rear side in accordance with a preferred embodiment. The vehicle display apparatus includes a temperature regulator 102 at least partially integrated with a side of a housing of the vehicle display apparatus 400. The vehicle display apparatus 400 further comprises at comprises at least two fluid flow outlets 402, 402' operable to transport the fluid flow 112 from the fluid flow inlet 110 towards the at least two fluid flow outlets 402, 402'. The at least two fluid flow outlets 402, 402' are connected by a fluid channel 404, the fluid channel 404 operable to transport the fluid flow 112 entering from the fluid flow inlet 110 towards the at least two fluid flow outlets 402, 402'. In an exemplary embodiment shown here in FIG. 4, the vehicle display apparatus 400 includes at least two display panels 406, 406', but not limited thereto. Although at least two display panels are shown in this exemplary embodiment, it shall be understood the main inventive concept of this disclosure is applicable to only one display panel. The display panel 406, 406' may be a type of twisted nematic (TN) display panel, for example liquid crystal display (LCD).

A main advantage of the temperature regulator 102 is to control a fluid flow 112 to regulate and maintain a desired operating temperature of the vehicle display apparatus 400. Besides prevention of overheating display apparatus, TN display panels such as LCD panels requires twisting of liquid crystals for polarization of light. When a temperature of the display apparatus is too low, the twisting of liquid crystals is at a slower rate and from a user perspective, the images displayed appears distorted. By regulating and maintaining the display apparatus at a desired temperature, the twisting rate of liquid crystals is optimised, thus achieving high-definition images.

The fluid channel 404 may isolated from other electronic components. An advantage of the aforesaid arrangement is to mitigate or prevent condensation within an ambient of the vehicle display apparatus 400. In an embodiment, the fluid channel 404 is at least partially surrounding an illumination source (not shown) operable to supply illumination to the display panels 406, 406'.

Figure 5:
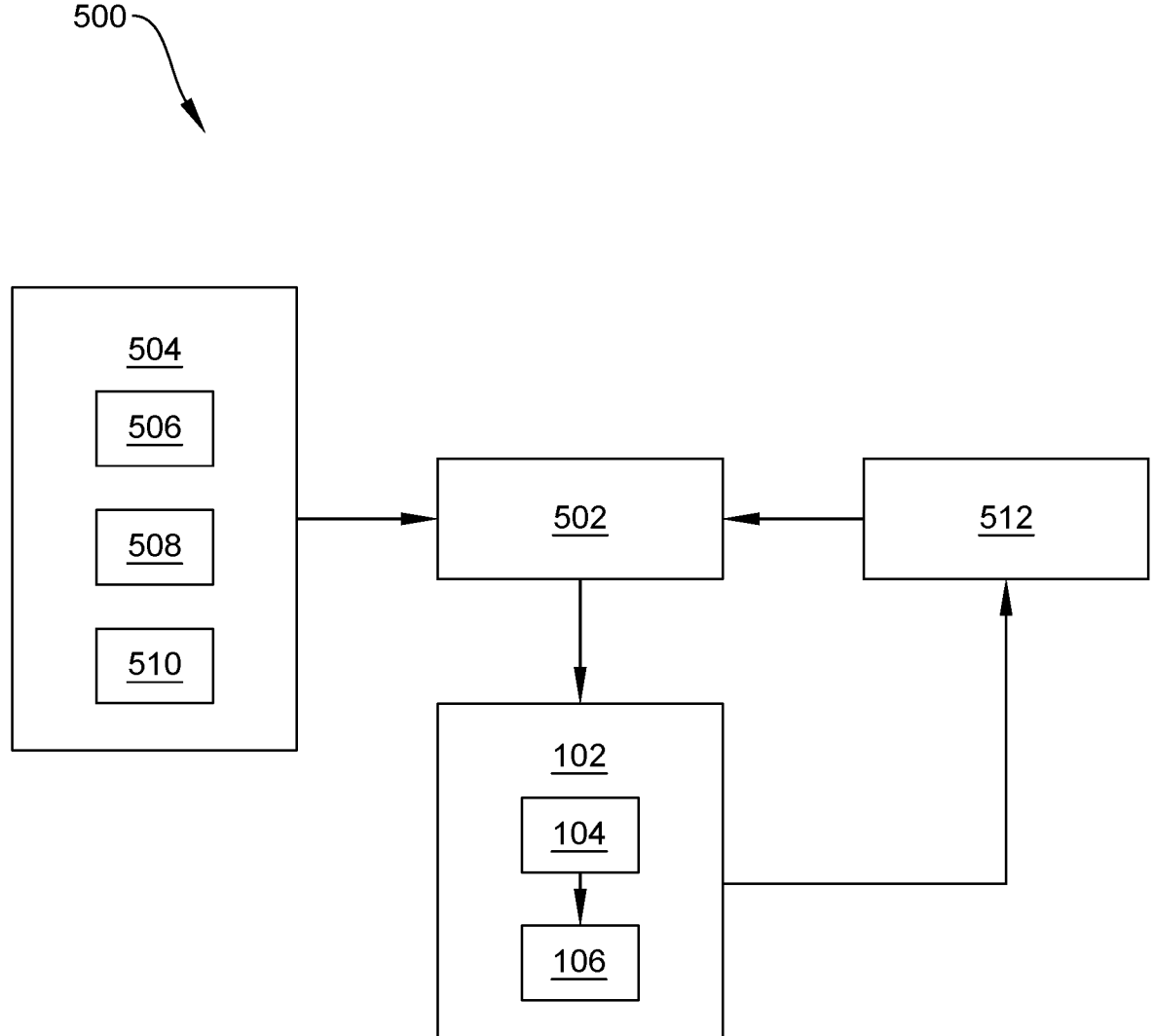
FIG. 5 shows a system block diagram of a vehicle display apparatus integrated with a temperature regulator in accordance with a preferred embodiment.

FIG. 5 shows a system 500 block diagram a vehicle display apparatus integrated with a temperature regulator 102 in accordance with a preferred embodiment. As shown in system block diagram 500 is a processor 502 in communication with the temperature regulator 102, which comprises an actuator 104 and a rotatable tab 106. The system 500 further comprises a temperature measurement module 504, the temperature measurement module 504 operable to measure a set of temperature measurements. The set of temperature measurements includes a temperature of a display panel of the vehicle display apparatus 506, an operating temperature of the HVAC system 508 and/or a temperature of a fluid flow from the HVAC system 510. The set of temperature measurements measured by the temperature measurement module 504 is transmitted to the processor 502. An advantage of the aforesaid arrangement is to achieve regulating and maintaining an operating temperature of the vehicle display apparatus through the processor 502, which will execute a command to rotate the actuator 104, such that the rotatable tab 106 prevents a fluid flow 112 to enter the fluid flow inlet 110, i.e., turn on or open position (FIG. 2 referred) or to prevent a fluid flow 112 to enter the fluid flow inlet 110, i.e., turn off or a closed position (FIG. 3 referred) in response to the set of temperature measurements measured by the temperature measurement module 504.

The system 500 further includes an angle measurement module 512 operable to determine an angle of the rotatable tab 106, to determine whether the temperature regulator 102 is at an open position (FIG. 2 referred), i.e., at a 90° angle to a width of the fluid flow inlet 110, or at a closed position, i.e., at a 0° angle to a width of the fluid flow inlet 110. In other words, when the temperature regulator 102 is at an open position, the shaft of the actuator 104 turns at a 90° angle such that the rotatable tab 106 is perpendicular to the width of the fluid flow inlet 110. When the temperature regulator 102 is at a close position, the shaft of the actuator 104 turns such that the rotatable tab 106 is at a 0° angle or horizontal to the width of the fluid flow inlet 110.

The angle of the rotatable tab 106 measured is transmitted to the processor 502, to determine whether the position of the rotatable tab 106 needs to be changed. In an embodiment, to increase the temperature of the vehicle display apparatus 400, the processor 502 executes a command to allow fluid flow 112 at a higher temperature compared to the operating temperature of the vehicle display apparatus 400. In an embodiment, to decrease the temperature of the vehicle display apparatus 400, the processor 502 executes a command to allow fluid flow 112 at a lower temperature compared to the operating temperature of the vehicle display apparatus 400.

In most embodiments, the fluid flow 112 is directed from a heating, ventilation and air-conditioning (HVAC) system, but not limited thereto. It shall be understood by a skilled practitioner, other suitable sources of fluid flow may be applicable to the main inventive concept of this disclosure.

Thus, it may be seen that a vehicle display apparatus integrated with a temperature regulator having the advantage of regulating and maintaining a temperature of the vehicle display apparatus at a desired operating temperature has been provided. A main advantage of this disclosure is to avoid image distortion and jittering caused by sluggish/slow twisting of TN display panel due to low temperature, yet at the same time avoid overheating of the TN display panel, by controlling a temperature of a vehicle display apparatus using a TN display panel. This is achievable by regulating and maintaining a temperature of the vehicle display apparatus at a desired operating temperature. Further, since the fluid flow for regulating and maintaining the vehicle display apparatus is from a HVAC system within a motor vehicle, no additional component or materials is required. While exemplary embodiments have been presented in the foregoing detailed description of the disclosure, it should be appreciated that a vast number of variation exist.

It should further be appreciated that the exemplary embodiments are only examples, and are not intended to limit the scope, applicability, operation or configuration of the disclosure in any way. Rather, the foregoing detailed description will provide those skilled in the art with a convenient road map for implementing an exemplary embodiment of the disclosure, it being understood that various changes may be made in the function and arrangement of elements and method of operation described in the exemplary embodiment without departing from the scope of the disclosure as set forth in the appended claims.

The following examples described further technical aspects of the devices, systems and methods described above and shall not be interpreted as claims.

The following examples may additionally be combined with any of the devices, systems and methods as described above or any subject-matter described in the claims as originally filed.

The invention claimed is:

1. A vehicle display apparatus comprising:

a display panel, a front side of the display configured to display information towards a front side of the vehicle display apparatus;

an illumination source operable to supply back-light illumination to the display panel, the illumination source arranged on a rear side of the display panel opposite the front side of the display panel;

a fluid flow inlet arranged on a rear side of the display panel;

a processor;

a temperature regulator operable to allow a fluid flow to enter the fluid flow inlet of the vehicle display apparatus or prevent the fluid flow from entering the fluid flow inlet of the vehicle display apparatus, wherein the temperature regulator comprises:

an actuator having a shaft, the actuator operable to rotate the shaft; and a rotatable tab in communication with the actuator, the rotatable tab operable to rotate synchronously in response to a rotation of the shaft;

a heating, ventilation and air-conditioning (HVAC) system operable to supply the fluid flow to enter the fluid flow inlet of the vehicle display apparatus;

at least one fluid flow outlet arranged on the rear side of the display panel, the at least one fluid flow outlet releasing the fluid flow in a rearward direction of the vehicle display apparatus; and a fluid channel entirely on the rear side of the display panel between the fluid flow inlet and the at least one fluid flow outlet, the fluid channel at least partially surrounding the illumination source.

2. The vehicle display apparatus according to claim 1, wherein the processor is operable to execute a command to allow the fluid flow to enter the fluid flow inlet of the vehicle display apparatus, or to prevent the fluid flow from entering the fluid flow inlet of the vehicle display apparatus.

3. The vehicle display apparatus according to claim 2, wherein in response to the command executed by the processor to allow the fluid flow to enter the fluid flow inlet of the vehicle display apparatus, the actuator is operable to rotate the shaft, thereby causing the rotatable tab to rotate synchronously at an angle of 90° to a width of the fluid flow inlet.

4. The vehicle display apparatus according to claim 2, wherein in response to the command executed by the processor to prevent the fluid flow from entering the fluid flow inlet of the vehicle display apparatus, the actuator is operable to rotate the shaft, thereby causing the rotatable tab to rotate synchronously at an angle of 0° to a width of the fluid flow inlet.

5. The vehicle display apparatus according to claim 1, wherein the vehicle display apparatus further comprises a temperature measurement module operable to measure a plurality of temperature measurements.

6. The vehicle display apparatus according to claim 5, wherein the plurality of temperature measurements com- prises a temperature of the display panel of the vehicle display apparatus, an operating temperature of the HVAC system, a temperature of the fluid flow from the HVAC system, or combination thereof.

7. The vehicle display apparatus according to claim 5, wherein the plurality of temperature measurements mea- sured is transmitted to the processor.

8. The vehicle apparatus according to claim 1, wherein the vehicle display apparatus further comprises an angle mea- surement module operable to determine an angle of the rotatable tab.

9. The vehicle display apparatus according to claim 8, wherein the angle of the rotatable tab measured is transmit- ted to the processor.

10. The vehicle display apparatus according to claim 1, wherein the at least one flow outlet comprises at least two fluid flow outlets operable to transport the fluid flow from the fluid flow inlet towards each of the at least two fluid flow outlets.

11. The vehicle display apparatus according to claim 10, wherein the at least two fluid flow outlets are connected by a respective portions of the fluid channel to transport the fluid flow from the fluid flow inlet towards the at least two fluid flow outlets.

12. The vehicle display apparatus according to claim 1, wherein the temperature regulator is at least partially inte- grated with the vehicle display apparatus through a housing of the vehicle display apparatus.

13. The vehicle display apparatus according to claim 1, wherein the display panel of the vehicle display apparatus comprises at least one type of twisted nematic display panel.

14. The vehicle display apparatus according to claim 1, wherein a temperature of the fluid flow to enter the fluid flow inlet of the vehicle display apparatus is lower than a tem- perature of the vehicle display apparatus, or the temperature of the fluid flow to enter the fluid flow inlet of the vehicle display apparatus is higher than the temperature of the vehicle display apparatus.

* * * * *